(12) United States Patent
Rana et al.

(10) Patent No.: US 8,088,675 B2
(45) Date of Patent: Jan. 3, 2012

(54) METHODS OF MAKING AN EMITTER HAVING A DESIRED DOPANT PROFILE

(75) Inventors: Virendra V. S. Rana, Los Gatos, CA (US); Robert Z. Bachrach, Burlingame, CA (US)

(73) Assignee: Applied Materials, Inc., Santa Clara, CA (US)

(*) Notice: Subject to any disclaimer, the term of this patent is extended or adjusted under 35 U.S.C. 154(b) by 104 days.

(21) Appl. No.: 12/562,734

(22) Filed: Sep. 18, 2009

(65) Prior Publication Data

US 2010/0240172 A1    Sep. 23, 2010

Related U.S. Application Data

(60) Provisional application No. 61/098,713, filed on Sep. 19, 2008, provisional application No. 61/098,718, filed on Sep. 19, 2008.

(51) Int. Cl.
*H01L 21/00* (2006.01)

(52) U.S. Cl. ......................... 438/482; 438/508

(58) Field of Classification Search .................. 438/482, 438/495, 501, 505, 508
See application file for complete search history.

(56) References Cited

U.S. PATENT DOCUMENTS

| | | | |
|---|---|---|---|
| 5,942,050 A | 8/1999 | Green et al. | |
| 6,385,020 B1 * | 5/2002 | Shin et al. | 361/15 |
| 6,794,275 B2 | 9/2004 | Kondo et al. | |
| 6,930,015 B2 * | 8/2005 | Ping et al. | 438/398 |
| 7,569,462 B2 | 8/2009 | Rana et al. | |
| 2003/0104664 A1 | 6/2003 | Kondo et al. | |
| 2004/0182433 A1 | 9/2004 | Terakawa et al. | |
| 2006/0228897 A1 | 10/2006 | Timans | |
| 2007/0235074 A1 | 10/2007 | Henley et al. | |
| 2008/0142763 A1 | 6/2008 | Rana et al. | |
| 2008/0179547 A1 | 7/2008 | Henley | |
| 2008/0295885 A1 | 12/2008 | Lee | |

FOREIGN PATENT DOCUMENTS

| | | |
|---|---|---|
| EP | 0 795 202 | 5/2003 |
| JP | 9181347 | 7/1997 |
| KR | 20020076791 | 10/2002 |
| WO | WO 96/17388 | 6/1996 |
| WO | WO2008076730 A1 | 6/2008 |

OTHER PUBLICATIONS

PCT International Search Report and Written Opinion dated May 3, 2010 for International Application No. PCT/US2009/057377.

* cited by examiner

*Primary Examiner* — Charles Garber
*Assistant Examiner* — Reema Patel
(74) *Attorney, Agent, or Firm* — Patterson & Sheridan, L.L.P.

(57) ABSTRACT

A method for obtaining a desired dopant profile of an emitter for a solar cell which includes depositing a first amorphous silicon layer having a first doping level over an upper surface of the crystalline silicon substrate, depositing a second amorphous silicon layer having a second doping level on the first amorphous silicon layer, and heating the crystalline silicon substrate and the first and second amorphous silicon layers to a temperature sufficient to cause solid phase epitaxial crystallization of the first and second amorphous silicon layers, such that the first and second amorphous silicon layers, after heating, have the same grain structure and crystal orientation as the underlying crystalline silicon substrate.

4 Claims, 7 Drawing Sheets

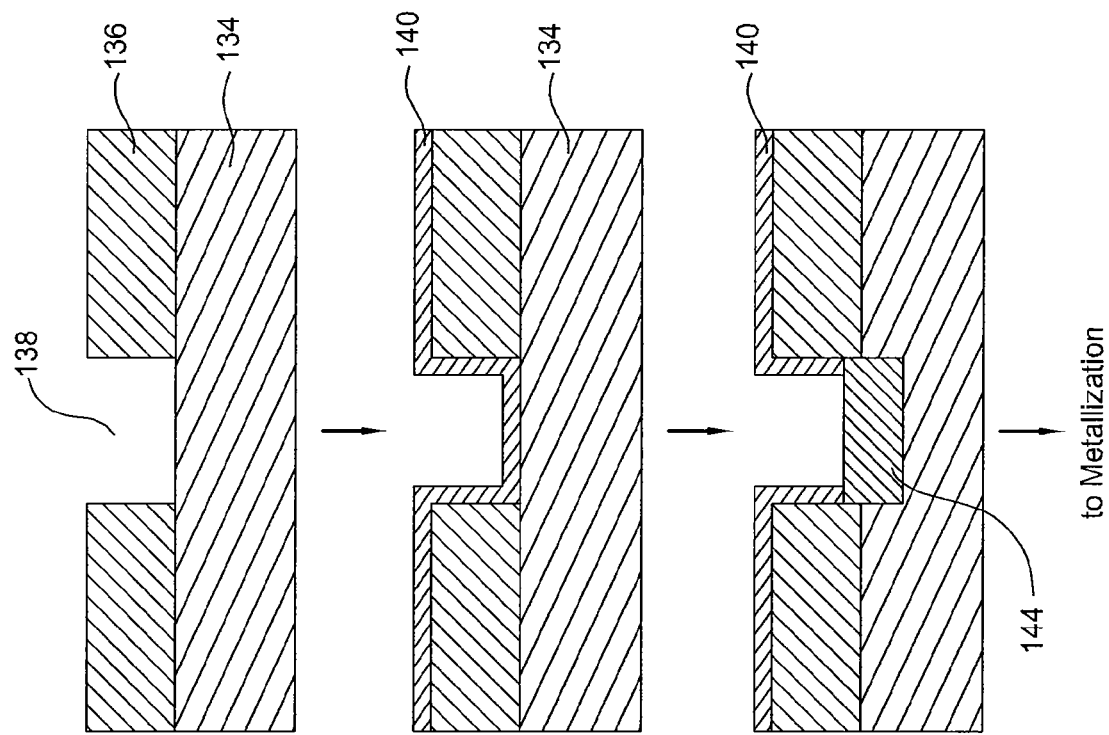

METHODS OF MAKING AN EMITTER HAVING A DESIRED DOPANT PROFILE

CROSS-REFERENCE TO RELATED APPLICATIONS

This application claims benefit of U.S. Provisional Patent Application Ser. No. 61/098,713, filed Sep. 19, 2008, and Provisional Patent Application Ser. No. 61/098,718, filed Sep. 19, 2008, which are both herein incorporated by reference in their entirety.

FIELD OF THE INVENTION

This invention relates generally to silicon solar cells and, more particularly, to a method for obtaining a desired dopant profile in the emitter of a solar cell device. The method allows for any desired profile of dopant in the emitter to maximize the cell performance.

DESCRIPTION OF THE RELATED ART

Solar cells are material junction devices which convert sunlight into direct current (DC) electrical power. Solar cells typically have one or more p-n junctions. Each junction comprises two different regions within a semiconductor material where one side is denoted as the p-type region and the other as the n-type region. When exposed to sunlight, the electrical field created at the p-n junction in the solar cell separates the free electrons and holes, thus generating a photovoltage. A circuit from the n-side to the p-side allows the flow of electrons when the solar cell is connected to an electrical load. Solar cells generate a specific amount of electric power and are tiled into modules sized to deliver the desired amount of system power. Solar modules are joined into panels with specific frames and connectors.

Typically, the p-n junctions are formed by diffusing an n-type dopant, such as phosphorous, into the surface of a p-type silicon sheet, wafer or substrate. One example to perform the phosphorous diffusion includes coating phosphosilicate glass (PSG) compounds onto the surface of the silicon substrate and carrying out diffusion/annealing inside a furnace. Another example of diffusing a phosphorous dopant into a silicon substrate includes bubbling nitrogen gas through liquid phosphorous oxychloride ($POCl_3$) sources, which are injected into an enclosed quartz tube in a furnace loaded with batch-type quartz boats containing the silicon substrates.

When the aforementioned processes are utilized to form the p-n junction in the silicon substrate, additional processing steps including etching of the phosphosilicate glass are required. In addition, the silicon substrates upon which the diffusion is accomplished are usually vertically stacked in quartz boats for insertion into a furnace. Such handling of the substrates inevitably results in breakage of some of the silicon substrates since they are relatively thin, being on the order of 0.3 mm thick or less.

Optimized solar cells usually mean maximum power generated by solar cell junction devices at minimum cost. Although phosphorous diffusion of the phosphorous doped n-type silicon material for solar junction formation could be created by the furnace type diffusion/annealing processes as discussed above, these processes require handling of gaseous diffusion processes and difficult gas sources and necessitate many additional pre-cleaning, post-cleaning, etching and stripping steps. Often times, impurities are incorporated into the silicon sheets after phosphorus diffusion. For example, a layer of phosphosilicate glass remained at the surface of the substrate may need to be etched by such as wet chemical etching in a diluted hydrofluoric acid solutions. In addition, after phosphorus diffusion, p-n junction isolation is often required to remove excess n-type regions at the edges of the silicon sheets by sand blasting, plasma etch, or laser cutting. Overall, these prior art junction formation techniques are not economic for solar cell fabrication.

In addition to the foregoing problems, when spatially emitters for solar cells are formed utilizing the foregoing phosphorous diffusion techniques, the resulting emitter generally includes a large region extending inwardly from the surface of the crystalline substrate where the concentration of the dopant is high, e.g., greater than $1 \times 10^{19}$ atoms/cm$^3$. This heavily doped region near the surface is typically referred to as a "dead" region in the literature because a high minority carrier recombination occurs in these regions. Hence, there is a large region of emitter where the dopant concentration is large enough to cause substantial recombination of charge carriers, thereby reducing the power generated.

Therefore, there is a need for a method for forming an emitter layer with a desired dopant profile such that a region of high recombination is minimized while at the same time the rest of the emitter has a low dopant concentration, thereby eliminating many of the pre-cleaning, post-cleaning, and etching steps present in the prior art while providing a high performance.

SUMMARY OF THE INVENTION

The present invention provides a method for forming an emitter in a crystalline silicon substrate by depositing a first lightly doped layer of amorphous silicon on a surface of the substrate. Thereafter, a second amorphous silicon layer which is heavily doped is deposited over the full or selected portions of the first deposited amorphous silicon layer. The layer stack is then subjected to a thermal treatment that generates a selectively heavily doped surface region where the metallization is to be applied.

Embodiments of the present invention provides a method for forming an emitter for a solar cell in a crystalline silicon substrate, comprising delivering a mixture of precursors comprising a silicon-containing compound and a dopant-containing compound into a vacuum deposition chamber in which the crystalline silicon substrate is disposed, depositing a first amorphous silicon layer having a first doping level over an upper surface of the crystalline silicon substrate, depositing a second amorphous silicon layer having a second doping level on the first amorphous silicon layer, and heating the crystalline silicon substrate and the first and second amorphous silicon layers to a temperature sufficient to cause solid phase epitaxial crystallization of the first and second amorphous silicon layers, such that the first and second amorphous silicon layers, after heating, have the same grain structure and crystal orientation as the underlying crystalline silicon substrate.

Embodiments of the present invention also provide a method for forming a selective emitter for a solar cell in a crystalline silicon substrate, comprising depositing a first amorphous silicon layer lightly doped with phosphorous on an upper surface of the crystalline silicon substrate, heating the crystalline silicon substrate and the lightly doped amorphous silicon layer at a temperature sufficient to diffuse the phosphorous in the lightly doped amorphous silicon layer into the crystalline silicon substrate, depositing a second amorphous silicon layer on the first amorphous silicon layer, wherein a phosphorous doping concentration in an upper region and a bottom region of the second amorphous silicon layer is lower than a phosphorous doping concentration between the upper and bottom regions of the second amorphous silicon layer, and depositing a passivation layer over an upper surface of the second amorphous silicon layer.

Embodiments of the present invention further provide a method for forming a selective emitter for a silicon solar cell in a crystalline silicon substrate, comprising depositing a first amorphous silicon layer doped with phosphorous at a first doping level on a first surface of the crystalline silicon substrate, heating a second surface of the crystalline silicon substrate with a temperature gradient across the crystalline silicon substrate to cause solid phase epitaxial crystallization of the first amorphous silicon layer, wherein the second surface is on the opposite side of the crystalline silicon substrate and is substantially parallel to the first surface of the crystalline silicon substrate, forming a passivation layer over the first amorphous silicon layer, laser ablating the passivation layer in pre-selected areas, and depositing a second amorphous silicon layer doped with phosphorous at a second doping level on the passivation layer and within pre-selected areas.

Embodiments of the present invention yet further provide a system for heat treating a substrate, comprising a first processing chamber having a first processing region and precursor source assembly, wherein the precursor source assembly is configured to deliver a silicon-containing gas and a dopant-containing gas to an upper surface of a substrate disposed in the first processing region to sequentially form a lightly doped and heavily doped amorphous silicon layers on the upper surface of the substrate, and a substrate support having a substrate supporting surface and a heating element that is positioned adjacent to the substrate supporting surface, wherein the substrate supporting surface is adapted to support a bottom surface of a substrate, and the heating element is configured to heat the substrate to a temperature that is sufficient to crystallize the doped amorphous silicon layers disposed on the upper surface of the substrate.

BRIEF DESCRIPTION OF THE DRAWINGS

So that the manner in which the above recited features can be understood in detail, a more particular description of the inventions, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 8a-8c are schematic diagrams showing a crystalline silicon substrate at various stages of formation of the heavily doped region for a selective emitter in accordance with yet another embodiment of the present invention.

DETAILED DESCRIPTION

The present invention provides a method for obtaining a desired emitter doping profile by depositing layers of amorphous silicon on a surface of a crystalline silicon substrate. The amorphous silicon, when it is deposited on the crystalline silicon substrate, may, in accordance with one embodiment of the present invention, be doped with doping material of the opposite conductivity type of the silicon substrate so as to provide a p-n junction when a doping material in the amorphous silicon has been diffused into the crystalline silicon substrate. For example, if the crystalline silicon substrate is formed of p-type silicon material, then the deposited amorphous silicon layer would be doped with phosphorous atoms to provide an n-type emitter layer on the surface of the crystalline silicon substrate. Either one or two layers of amorphous silicon are deposited on the silicon substrate. If two layers of amorphous silicon are deposited on the substrate, then the first layer may be lightly doped to form the bulk of the emitter, and the second layer, which is a thin heavily doped layer, is deposited onto the first lightly doped amorphous silicon layer to limit the thickness of the "dead" region as discuss previously. The doping in the lightly doped layer is low enough so that the recombination of the minority carriers is inhibited or reduced, resulting in high carrier collection. A passivation layer may be further provided over the thin heavily doped layer. Thereafter, the substrate with these two doped amorphous silicon layers and the passivation layer is annealed. Upon annealing process, phosphorous is trapped against the passivation layer surface, providing an additional front surface field to further deflect minority carriers away from the passivation layer/emitter surface. Meanwhile, the phosphorous will diffuse into the p-type crystalline silicon substrate thereby forming the p-n junction.

Emitter with Desired Dopant Profile

Figure 1:
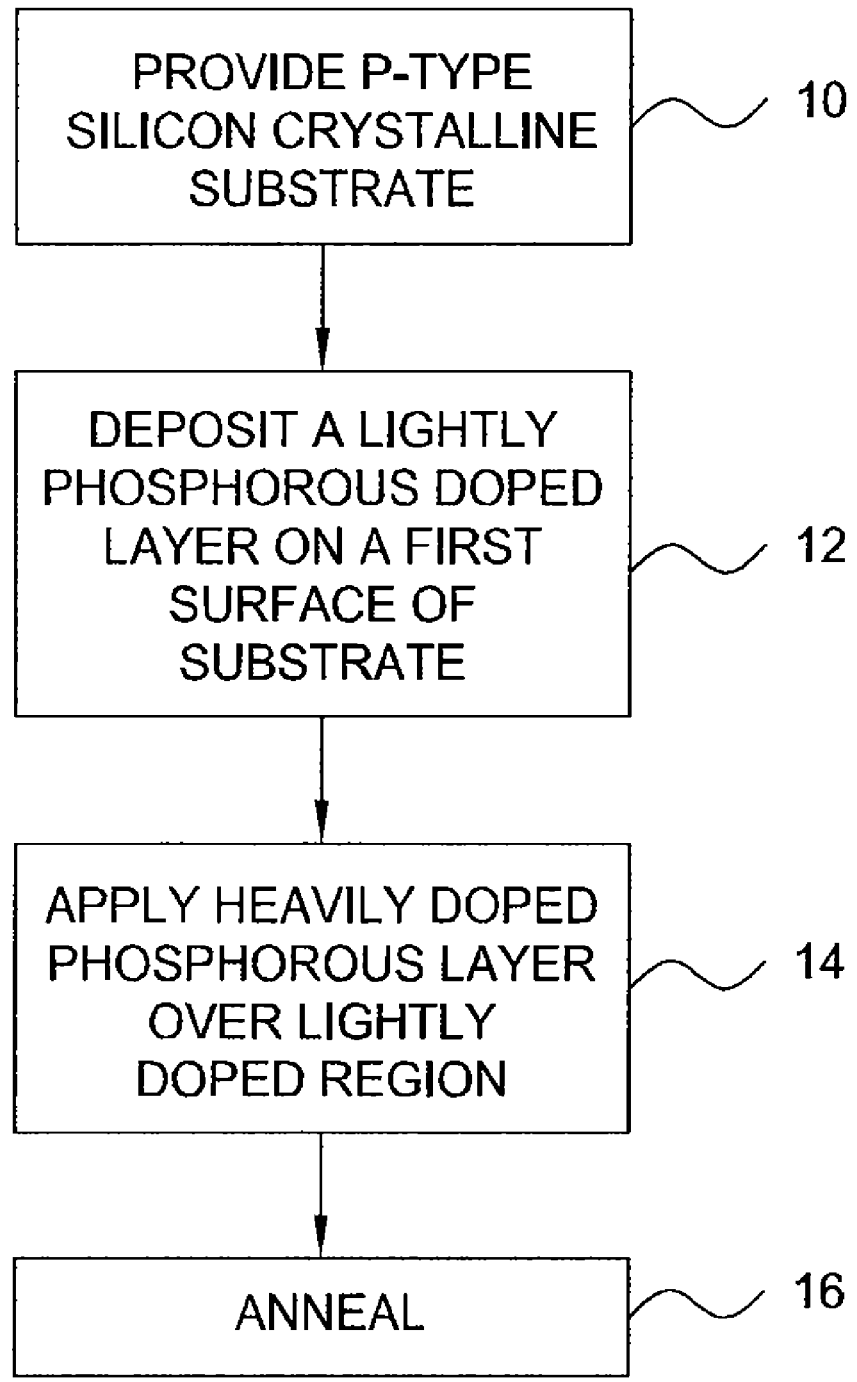
FIG. 1 is a process flow diagram depicting one embodiment of a method of the present invention.

FIG. 1 depicts a process flow diagram illustrating one embodiment of a method of forming a desired emitter dopant profile as described above. As is shown therein, there is provided at step 10 a p-type crystalline silicon substrate into a vacuum deposition chamber. The vacuum deposition chamber may be a PECVD chamber, either a stand-alone chamber or part of a multi-chamber processing system. The substrate may be formed of single crystalline silicon or multi-crystalline silicon depending on the particular application of the product to be produced. In one embodiment, the substrate is a monocrystalline substrate (e.g., Si<100> or Si<111>). Thereafter, the substrate may go through a damage layer removal and texture etching process to form a textured surface, thereby promoting light trapping in the solar cells to improve conversion efficiency.

The p-type crystalline silicon substrate has a first surface and a second surface. The first surface is generally opposite to the second surface and on the opposite side of the p-type crystalline silicon substrate. In one embodiment, precursors of silicon-containing compounds are delivered to the vacuum deposition chamber. The silicon-containing compounds may be any suitable silicon source such as a $Si_xF_y$ or $Si_xH_y$ gas, or combinations thereof, wherein x has a range of 0 to 2, y has a range of 4 to 6. In one example, the silicon-containing compound may include silane ($SiH_4$), disilane ($Si_2H_6$), or tetrafluorosilane ($SiF_4$), for depositing a layer of amorphous silicon directly onto the first surface of the crystalline silicon substrate. The silicon-containing compound may be delivered at a flow rate of about 10 standard cubic centimeter per minute (sccm) or higher, depending on the size of the crystalline silicon substrate and vapor deposition chamber. In one example, the silicon-containing compound is delivered at a flow rate between about 50 sccm and about 500 sccm. When a p-n junction is to be formed in the surface of the silicon substrate, the precursors may include a phosphorous-containing compound, such as phosphine ($PH_3$), assuming that the silicon substrate is of p-type silicon material. In one example, the phosphorous-containing compound is delivered diluted in hydrogen to a concentration of about 0.5 to about 10 percent, at a flow rate of about 5 sccm to about 50 sccm, to deposit a lightly phosphorous doped layer on the first surface of the substrate, as illustrated at step 12.

The mixture of precursors delivered to the deposition chamber may also include a hydrogen-containing compound including, but not limited to, hydrogen gas ($H_2$), ammonium ($NH_3$) and combinations thereof. The hydrogen-containing compound can be delivered at a flow rate between about 0 sccm and about 1000 sccm. It is contemplated that the flow rates of silicon-containing compound, phosphorous-containing compound, or hydrogen-containing compound may vary upon the size of the crystalline silicon substrate and the volume of the deposition chamber. For example, in one example, a mixture of the precursors may include silane, hydrogen gas and phosphine at a concentration greater than about $1.5 \times 10^{-5}$ $PH_3/SiH_4$ ratio for depositing a lightly phosphorous-doped amorphous silicon layer on the first surface of the crystalline silicon substrate. The ratio mentioned here is for $PH_3$ concentration in a gas stream, where it is diluted to about 0.5% with hydrogen. The doping level of the lightly doped amorphous silicon layer may be greater than about $1 \times 10^{18}$ atoms/$cm^3$, but after a suitable annealing process the dopant concentration of this lightly doped amorphous silicon layer in the emitter is less than or equal to about $1 \times 10^{18}$ atoms/$cm^3$. In this particular embodiment, the doping level of the lightly doped amorphous silicon layer is typically less than about $1 \times 10^{19}$ atoms/$cm^3$.

Subsequent to the deposition of the lightly doped amorphous silicon layer, a heavily doped phosphorous amorphous silicon layer is applied over the lightly doped region, as illustrated at step 14. In one example, the deposition of the heavily doped amorphous silicon layer may be accomplished by increasing the concentration of the phosphorous-containing compound, such as phosphine, to approximately about $1.5 \times 10^{-3}$ $PH_3/SiH_4$ ratio to provide a doping level greater than about $1 \times 10^{19}$ atoms/$cm^3$. The concentration of the phosphorous atoms in the heavily doped layer is on the order of about $1 \times 10^{20}$ atoms/$cm^3$ to $1 \times 10^{22}$ atoms/$cm^3$. In this particular embodiment, the doping level of the heavily doped amorphous silicon layer is typically greater than about $1 \times 10^{19}$ atoms/$cm^3$.

The lightly doped layer of amorphous silicon layer may be deposited at a layer thickness from about 50 Å to about 3000 Å while the heavily doped layer of amorphous silicon layer is deposited at a layer thickness from about 10 Å to about 100 Å. In one example, the lightly doped layer of amorphous silicon layer is deposited at a layer thickness higher than 3000 Å. In another example, the heavily doped layer of amorphous silicon layer is deposited at a layer thickness higher than 100 Å.

It is contemplated that these flow rates can be scaled according to the size of the substrate and the volume of the process chamber that is being used for deposition.

As shown at step 16, after the two layers of amorphous silicon layer have been deposited on the surface of the substrate, the substrate with the lightly and heavily doped amorphous silicon layers is annealed by delivering heat energy to the substrate at a desired temperature for a desired period of time sufficient to form the emitter. In this embodiment, the annealing is accomplished in a manner which will cause the amorphous layer to directionally crystallize via a solid phase epitaxy process on the crystalline silicon substrate while at the same time achieving the desired activation of the phosphorous atoms and diffusing the phosphorous atoms into the silicon substrate to a desired distance. As can be seen in FIG. 4, the heat 355 may be applied to the second surface 250 of the substrate 36, which is generally parallel and opposite to the first surface 74 of the substrate upon which the amorphous silicon layers 71, 73 have been deposited, so as to create a temperature gradient across the crystalline silicon substrate, i.e., between the second surface 250 of the substrate and the phosphorous doped amorphous silicon layers 71, 73. Therefore, the temperature of the second layer of amorphous silicon deposited on the first surface of the crystalline silicon substrate is higher than the temperature of first layer of amorphous silicon a distance in a direction substantially normal, or perpendicular, to the substrate surface. The resulting structure provides an emitter having a profile of a thin heavily doped region 71 followed by a bulk lightly doped region 73 deposited on the first surface 74 of the substrate.

The heat is preferably applied so that the application of the heat is controlled and limited to being applied to the second surface of the substrate. Typically, this is accomplished through the utilization of a rapid thermal processing (RTP) chamber, and the heating of the second surface of the silicon substrate is accomplished by applying heat at about 750° C. to about 1,200° C. for a period of approximately 5 seconds to 120 seconds to typically generate a temperature gradient of approximately 5° C. across the silicon substrate. In one example, the heat is applied for a period of approximately 120 seconds to 30 minutes to generate a temperature gradient and anneal the substrate. In yet another example, the heat is applied for a period of over 30 minutes to generate a temperature gradient and anneal the substrate. The application of the temperature gradient causes the amorphous silicon layers to recrystallize, resulting in solid phase epitaxial growth that starts at the interface with the crystalline silicon substrate, and continuing outwardly to an outer surface of the amorphous silicon layers. At the same time, the doping atoms in the deposited lightly doped amorphous layer will also diffuse into the p-type substrate during the solid phase epitaxial crystallization. Once this crystallization process is finished, the lightly doped and heavily doped amorphous silicon layers will be converted to crystalline silicon material having the same grain structure and crystal orientation as that of the underlying crystalline silicon substrate. In the event that the amorphous silicon material is phosphorous doped (n-type) and the crystalline silicon substrate is doped p-type, a p-n junction will be formed as a result of this epitaxial formation of the converted doped amorphous silicon material. It should be appreciated by a skilled artisan in the art that the depth of the p-n junction can be controlled by manipulating the level of phosphorous doping in the deposited lightly doped amorphous layer, the annealing temperature, or the processing time.

Optionally, it may be advantageous to deposit a passivation layer, for example SiN, over the heavily doped phosphorous layer prior to the annealing step since the passivation layer not only provides the required surface passivation, but also prevents the loss of phosphorous atoms into the processing chamber environment during the recrystallization process. In the embodiment where SiN passivation layer is deposited, the phosphorous atoms are trapped during the annealing step against the surface of the SiN layer which provides an additional front surface field to further deflect the minority carriers away from the SiN/emitter surface. When the passivation layer is desired, the passivation layer may be deposited in the same or a different vacuum deposition chamber.

The silicon nitride passivation layer is deposited from a mixture of silicon-containing gas and one or more nitrogen containing gases. In one example, silicon-containing gases may include silane, disilane, tetrafluorosilane, or the like. The passivation layer formation process may include providing a nitrogen containing gas and/or an oxygen containing gas from a gas source into the processing region of a processing chamber to oxidize and consume at least a portion of the amorphous silicon layer. In one example, the nitrogen-containing gases may include ammonia ($NH_3$), nitrous oxide ($N_2O$), nitric oxide (NO), nitrogen gas ($N_2$), combinations thereof, or derivatives thereof. Hydrogen-containing gases, such as hydrogen gas, may also be provided for depositing the passivation layer to improve layer surface properties. During the deposition of the passivation layer, the phosphine gas is terminated, the silane gas flow is reduced to about 200 sccm, and a nitrogen gas is provided into the PECVD chamber at a flow rate of approximately 5400 sccm for a period of approximately 45 seconds in order to form the passivating SiN layer over the heavily doped amorphous silicon layer.

It is contemplated that a different material of the passivation layer may be considered. For instance, the passivation layer may be a silicon oxide layer ($SiO_x$) or silicon oxynitride (SiON) layer. The passivation layer formation process may be performed at a temperature greater than about 800° C. using a conventional thermal oxidation process, such as a furnace annealing process, a rapid thermal oxidation process, an atmospheric pressure or low pressure CVD process, a plasma enhanced CVD process, a PVD process, hot wire CVD or applied using a spray-on, spin-on, roll-on, screen printed, or other similar type of deposition process.

In addition to deposition processes stated above, the desired spatially differential doping profile may be achieved in several different ways. One way is to subject the crystalline silicon substrate to sequential ion implantation of a dopant at different energy and concentration levels to achieve the desired dopant profile, such as a desired phosphorous dopant profile. For example, the p-type silicon substrate could be inserted into a plasma generation chamber and a phosphine gas entrained in a hydrogen carrier may be inserted into this chamber where a plasma is ignited to cause a plasma immersion ion implantation of the phosphorous atoms into the surface of the crystalline silicon substrate that is biased to attract the dopant ions. For example, the phosphine gas may be delivered diluted in the hydrogen carrier to a desired concentration with a suitable power applied for a period of time, so as to provide a silicon substrate with a surface having concentration of phosphorous atoms less than about $1\times10^{18}$ atoms/cm$^3$. Thereafter, the concentration of the phosphine gas may be increased to a desired concentration for a period of time with a suitable power, resulting in the deposition of a heavily doped phosphorous layer over the lightly doped phosphorous layer such that the concentration of the phosphorous atoms in the heavily doped layer is approximately higher than about $1\times10^{19}$ atoms/cm$^3$. Thereafter, an optionally passivation layer may be deposited over the top of the heavily doped phosphorous layer using a thermal oxidation process as described above, followed by the annealing step to accomplish the desired dopant profile, thereby obtaining a thin heavily doped layer at the surface of the substrate and an underlying lightly doped layer deposited on the upper surface of the substrate.

The embodiment described here in conjunction with FIG. 1 relates to the formation of an emitter layer. The present invention also contemplates a different embodiment of using a selective emitter structure, which will be discussed further below in the section entitled "Selective Emitter" in conjunction with FIGS. 5-8.

Figure 2:
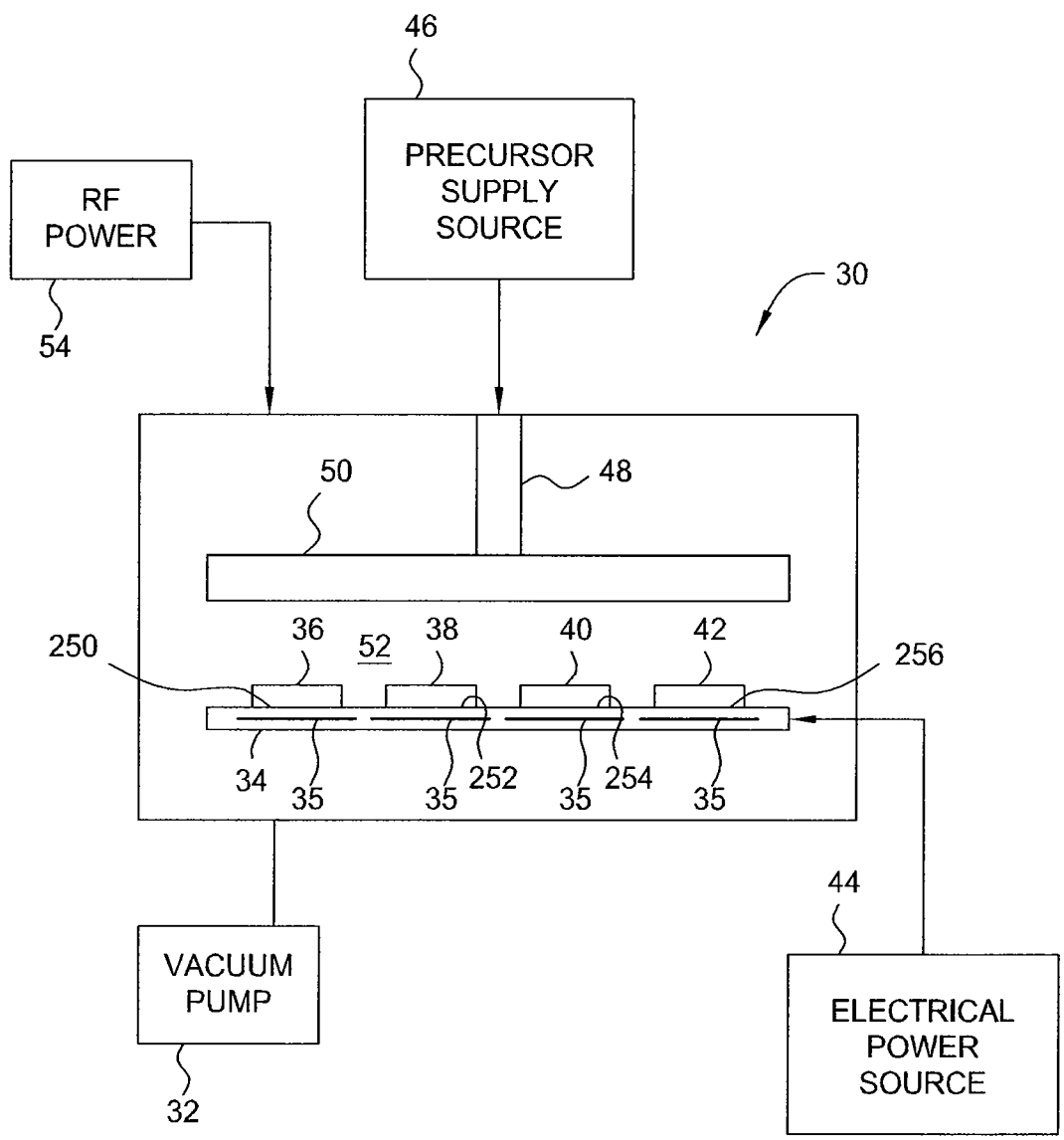
FIG. 2 is a schematic, cross-sectional representation of a vacuum deposition chamber that may be used in carrying out deposition processes of the present invention.

FIG. 2 is a schematic, cross-sectional representation of a plasma enhanced chemical vapor deposition (PECVD) chamber 30 that may be used in carrying out processes of the present invention. The chamber 30 includes a plurality of walls enclosing a processing area 52 which may be evacuated by a vacuum pump 32. Disposed internally of the chamber 30 is a support 34 upon which a plurality of crystalline silicon substrates 36, 38, 40 and 42 may be disposed. As shown in FIG. 2, the substrates 36, 38, 40 and 42 are positioned horizontally on the support 34. The support 34 is provided with one or more heating elements 35 that are embedded therein and connected to an electrical power source 44 to heat the substrates 36, 38, 40, 42 to a temperature which is required for thermal processing of the substrates within the chamber 30. In one embodiment, the heating element 35 is a resistive heating element, or a halogen lamp. As will be discussed below, the heating is accomplished by applying heat at a suitable temperature for a period of time to form a desired temperature gradient across the silicon substrates 36, 38, 40 and 42 from one side where the heating element is located to the other side on which the heavily and lightly doped layers are deposited.

A precursor supply source 46 is connected to a conduit 48 for conveying appropriate compounds to a showerhead 50 which distributes the precursor compounds throughout the processing area 52 within the chamber 30. The precursor compounds may be energized into plasma within the processing area 52 by the application of RF power from a source 54 to create an appropriate field between the showerhead 50 and the support 34 (which is typically electrically grounded). The plasma produces ions within the processing area 52 which will result in deposition of amorphous silicon upon the substrate surfaces facing the showerhead 50. The chamber 30 as described herein is an AKT™ series PECVD chamber available from Applied Materials, Inc., located in Santa Clara, Calif. For a more detailed illustration and explanation of one embodiment of a PECVD process useful for carrying out embodiments of the present invention, reference is made to U.S. Pub. No. 2006/0060138 A1, entitled "DIFFUSER GRAVITY SUPPORT", which is incorporated in its entirety herein. It is also contemplated that other processing chambers, such as a high-density plasma CVD tool, hot wire chemical vapor deposition (HWCVD) chambers or atomic layer deposition (ALD) chambers, may also be used to practice aspects of the present inventions.

To obtain the desired emitter dopant profile as illustrated in FIG. 1, steps 12 and 14, the plasma deposition within the chamber 30 generally continue for a period of time sufficient to deposit a first layer of amorphous silicon layer of approximately 50 Å to 3,000 Å or thicker as desired for the depth of the emitter in the substrate. As described above, if desired, this layer of amorphous silicon layer may be doped with phosphorous to provide an emitter with a dopant concentration at about $1\times10^{18}$ atoms/cm$^3$ or less after anneal. Thereafter, the concentration of the phosphorous in the precursor supply source 46 may be increased to deposit a second layer of heavily doped amorphous silicon layer of a desired thickness on the first lightly doped amorphous silicon layer. The doping concentration of the heavily doped amorphous silicon is typically higher than about $1 \times 10^{19}$ atoms/cm$^3$ or higher after anneal, as previously described.

Figure 3:
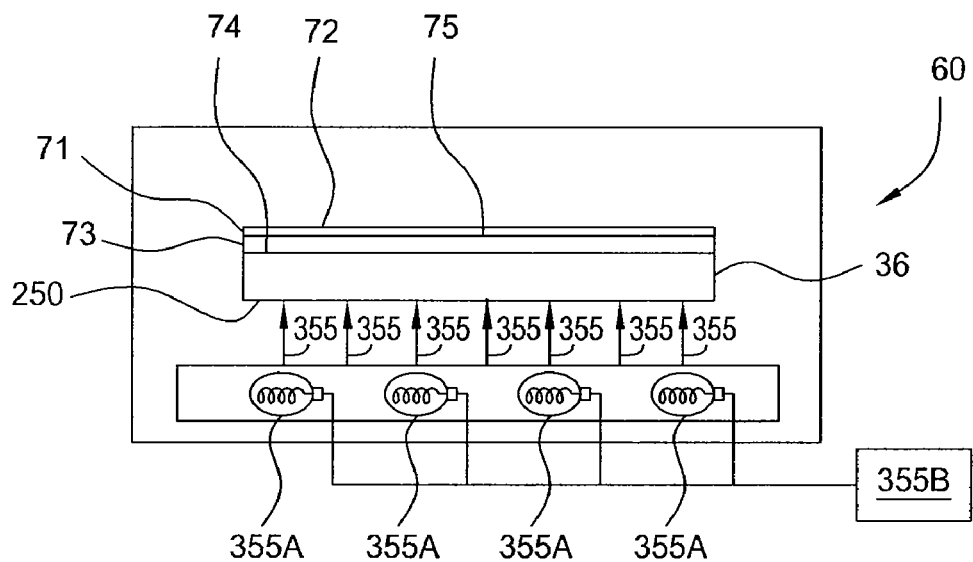
FIG. 3 is a schematic, cross-sectional diagram of an annealing furnace used to anneal a substrate according to one embodiment of the present invention.

FIG. 3 is a schematic, cross-sectional view of a chamber 60 for heating the second surfaces 250, 252, 254, and 256 of the silicon substrates 36, 38, 40, and 42 as illustrated in FIG. 2. In this embodiment, the chamber 60 is a rapid thermal processing (RTP) chamber within which the application of the heat is controlled. For clarity, a single substrate 36 is shown in FIG. 3. As an example, the crystalline substrate 36 has a lightly doped layer of amorphous silicon layer 73 deposited thereover. A heavily doped layer of amorphous silicon 71 is deposited on top of the lightly doped layer of amorphous silicon layer 73. Optionally, a passivation layer (not shown), for example SiN, may be applied over the heavily doped phosphorous layer prior to or after the annealing step, as described previously.

As shown in FIG. 3, one or more heating elements 355A are located under the second surfaces 250 of the silicon substrate 36, providing heat energy 355 to the second surface 250 of the substrate that is parallel and opposite to the first surface 74 of the silicon substrates 36. The heating elements 355A are connected to a lamp controller 355B that is used to control desired heating parameters during the process. In one example, the heating element 355A is an IR heating lamp, or a halogen lamp which provides sufficient energy to thermally process the substrate. The heating element 355A may be configured to heat the second surface, such as second substrate surfaces 250, 252, 254, 256 of the crystalline silicon substrates 36, 38, 40, 42 (FIG. 2), which is on the opposite side of the substrate from the side on which the doped amorphous silicon layers 71, 73 are deposited, thereby creating a temperature gradient across the silicon substrate 36, that is, from the second surface 250 of the substrate where the heating element 355A is located to a top surface 72 of the heavily doped amorphous silicon layer 71. The heat energy 355 may be applied to the second surface 250 of the silicon substrate 36 at a temperature of about 750° C. to about 1200° C. for a time period of about 5 seconds to about 30 seconds. In another example, the heat energy 355 is applied to the second surface 250 of the silicon substrate 36 at a temperature of about 1000° C. for a period of about 30 seconds. In yet another example, the heat energy 355 is applied to the second surface 250 of the silicon substrate 36 at a temperature of about 950° C. for a time period of about 120 seconds. In one another example, the heat energy 355 is applied to the second substrate surface 250 of the silicon substrate 36 at a temperature of about 1000° C. for a time period of about 120 seconds. The application of heat energy 355 to the second surface 250 of the substrate 36 generally creates a temperature gradient between about 2° C. and 10° C. In one example, the temperature gradient is about 5° C.

For clarity, the first surface 74 of the substrate 36 described herein is referring to the surface of the substrate that has the lightly doped amorphous silicon layer 73 deposited thereon. In addition, the second surface of the substrate is the surface that is generally parallel and opposite to the first surface 74 of the substrate 36. The heating element 355A (FIG. 3) or 35 (FIG. 2) is generally used to create a temperature gradient between the first surface and the second surface of the substrate, such that a temperature of an interface between the lightly doped amorphous silicon layer 73 and the crystalline silicon substrate 36 is higher than a temperature of a point in the heavily doped amorphous silicon layer 71 that is distance from the interface between the lightly doped amorphous silicon layer 73 and the crystalline silicon substrate 36.

Figure 4A:
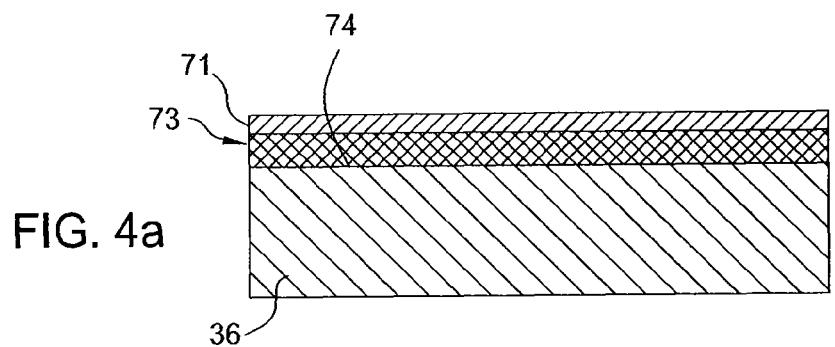
FIGS. 4a-4c are schematic diagrams showing a silicon substrate at various stages of processing to form a desired emitter dopant profile according to one embodiment of the present invention.
Figure 4B:
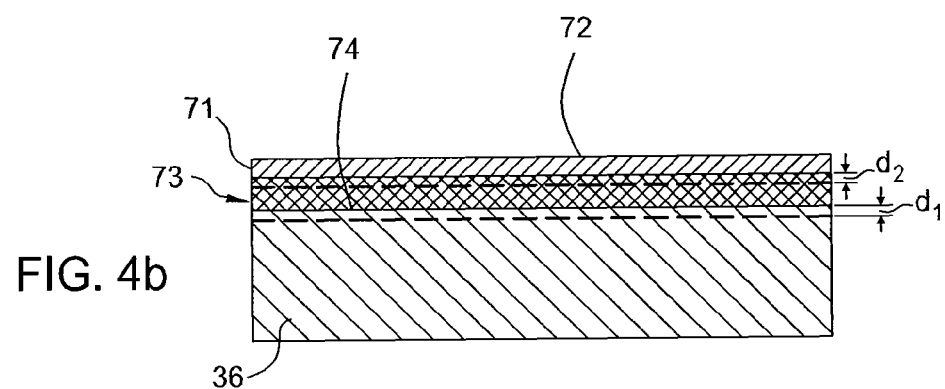
Figure 4C:
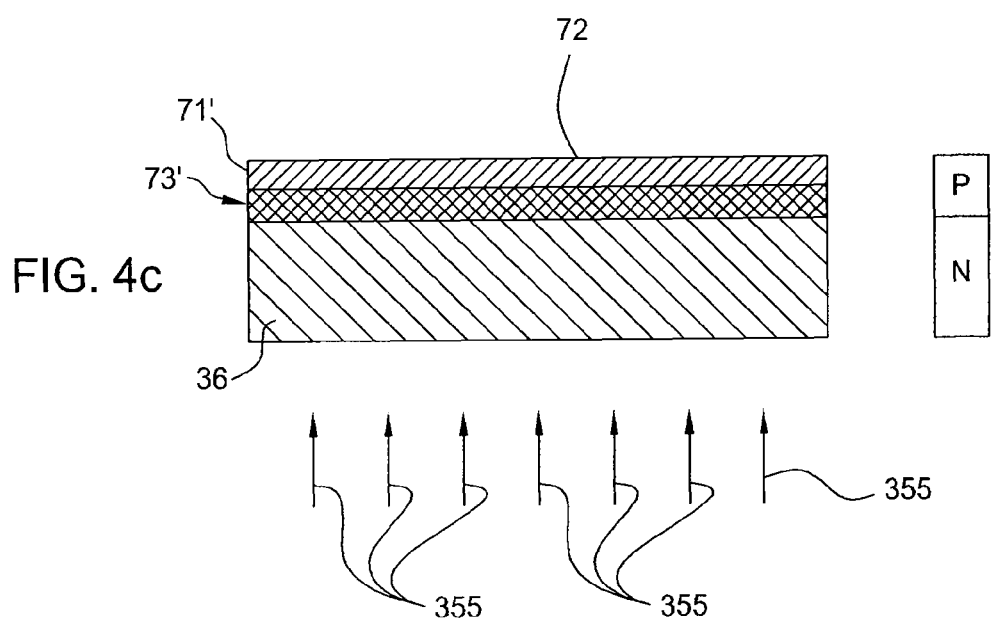

FIGS. 4a-4c are schematic diagrams showing a silicon substrate at various stages of processing to form a desired emitter dopant profile according to one embodiment of the present invention. The embodiment illustrated in FIG. 4a shows a substrate 36 having a first lightly doped amorphous silicon layer 73 and a second heavily doped amorphous silicon layer 71 sequentially deposited on a first surface 74 of the substrate 36. Thereafter, the substrate 36 with the deposited amorphous silicon layers 73, 71 is annealed with directional heat energy 355 at a temperature sufficient to activate and cause the dopant atoms (e.g., phosphorous) in the lightly and heavily doped amorphous silicon layers 73, 71 to diffuse into the substrate 36 a desired distance, depending upon the given heating energy. The dotted lines in FIG. 4b shows the status of the structure after the lightly doped layer 73 has been diffused into the first surface of the substrate a desired distance d1 and the heavily doped layer 71 has been diffused into the lightly doped layer 73 a desired distance d2. At the same time of diffusion, the heat energy 355 will also crystallize the lightly and heavily doped amorphous silicon layers 73, 71, so that a single crystalline layer having a new arrangement of crystals or grains propagates from the interface between the lightly doped amorphous silicon layer 73 and the crystalline silicon substrate 36 throughout the lightly doped and heavily doped amorphous silicon layers 73, 71. Upon the completion of this directional crystallization process, the converted silicon layers 73', 71', which were in amorphous state, will assume the same grain structure as the underlying crystalline silicon substrate 36 due to solid phase epitaxial growth from the first surface 74 of the substrate 36 having that grain structure.

The resulting crystalline structure after heat treatment in the RTP chamber has a consistent grain structure, as shown in FIG. 4c. If an original substrate 36 is a single crystal silicon, then the epitaxially-grown, converted silicon layers 73', 71' will be a single crystal silicon material having the same grain structure as that of the original substrate. Upon the conversion of the amorphous silicon material, the lightly doped and heavily doped amorphous silicon layers 73, 71 as well as a region to which the phosphorous atoms from the lightly doped amorphous silicon layer is diffused will become a doped n-type region within the p-type single crystal silicon substrate 36 (i.e., a p-n junction), providing an emitter useful in a silicon solar cell.

In the embodiment described above, the process of depositing doped amorphous silicon layers on a crystalline silicon substrate, the formation of the passivation layer over the doped amorphous silicon layer, and the process of crystallizing the doped amorphous silicon layers are all performed in a single processing chamber (e.g., chamber 30). In one example, the passivation layer formation process is performed in a separate processing chamber that is similarly configured as the chamber 30 shown in FIG. 2. A first processing chamber, which is configured to form amorphous silicon layers on a substrate, is transferrably coupled to a second processing chamber, which is adapted to form the passivation layer over the formed amorphous silicon layers by use of a robotic device (e.g., SCARA robot). The first and second processing chambers are each connected to a central transfer chamber (not shown) that has a robotic device (not shown) and pump (not shown) that are used in combination to transfer one or more substrates between the first and second processing chambers in an inert gas containing and/or vacuum low pressure environment. In another example, a processing system (not shown) generally comprises a first processing chamber that is configured to deposit amorphous silicon layers 71, 73 on a crystalline silicon substrate 36, a second processing chamber that is configured to form the passivation layer over the amorphous silicon layers 71, 73 and a third processing chamber that is configured to perform a crystallization process, where each of the processing chambers are connected to a central transfer chamber (not shown) that has a robotic device (not shown) and pump (not shown) that are used in combination to transfer one or more substrates between the first, second and third processing chambers in an inert gas containing and/or vacuum low pressure environment. An example of a central transfer chamber and processing system that may be adapted to perform one or more of the processes and/or accept one or more of the processing chambers described herein is further disclosed in the commonly assigned issued U.S. Pat. No. 5,186,718, entitled "STAGED-VACUUM WAFER PROCESSING SYSTEM AND METHOD," filed on Apr. 15, 1991, and U.S. Pat. No. 6,440,261, entitled "DUAL BUFFER CHAMBER CLUSTER TOOL FOR SEMICONDUCTOR WAFER PROCESSING," filed on May 25, 1999, which are both incorporated by reference herein in their entirety.

Although not described or shown here, it is contemplated that following the deposition processes described above, additional processes such as metallization or patterning processes may be included to provide the front and rear contacts for a solar cell.

Selective Emitter

The above describes various embodiments of the present inventions showing a two layer stack with different doping levels to create a n-type emitter. The present invention below in conjunction with FIGS. 5-8 further provide a method for forming a selective emitter used in solar cell.

Figure 5:
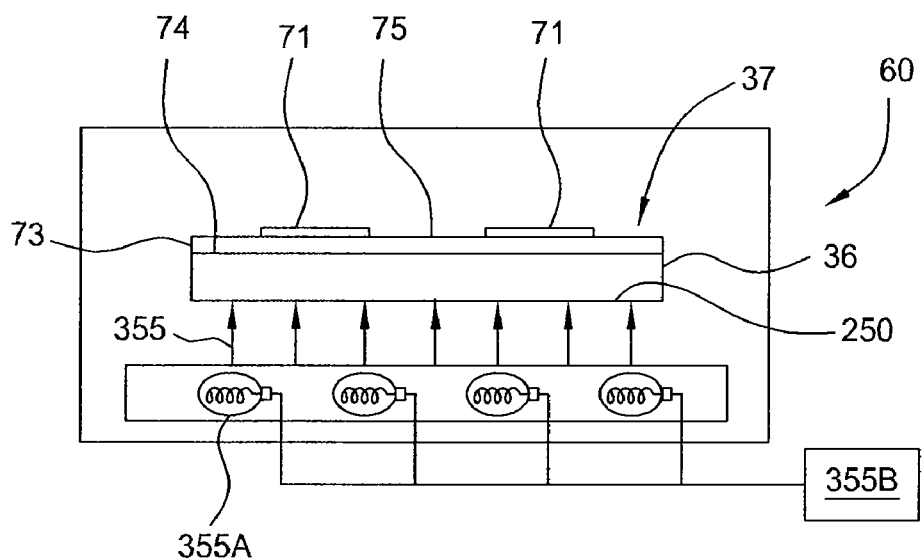
FIG. 5 is a schematic diagram of a rapid thermal processing (RTP) furnace used to anneal a substrate according to another embodiment of the invention.
Figure 6:
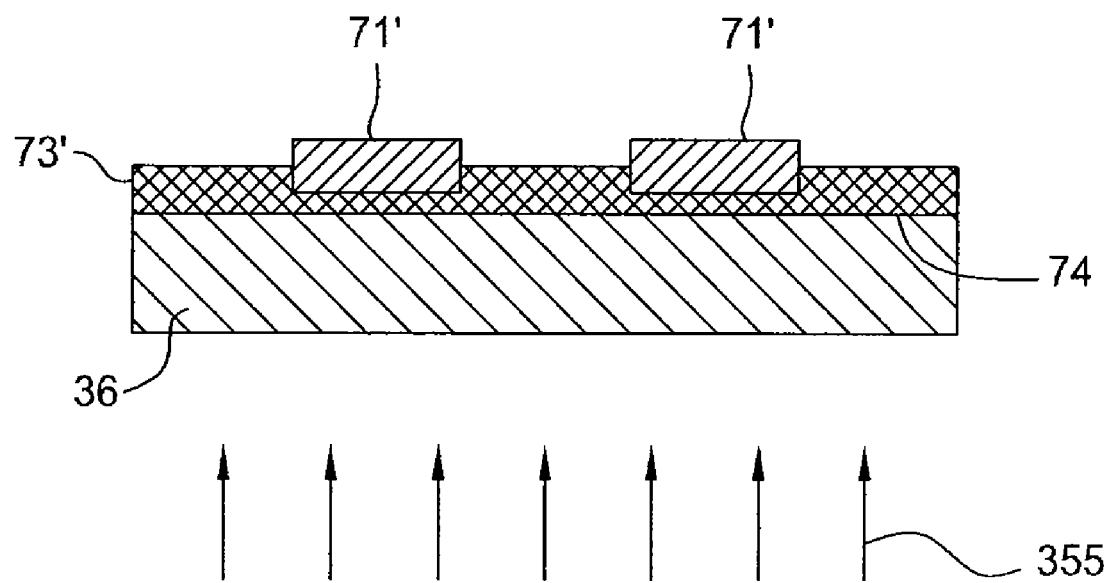
FIG. 6 is a schematic cross-sectional view depicting a resulting structure of the silicon substrate according to the embodiment shown in FIG. 5.

FIG. 5 illustrates a chamber 60 which provides the ability to apply heat to a lower or second surface 250 of a silicon substrate 36. For clarity, a single substrate 36 is shown in FIG. 5. The heating mechanism is similar to FIG. 3 as discussed above and therefore will not be redundantly repeated here. In one embodiment shown in FIG. 5, a first layer 73 of lightly doped amorphous silicon is deposited on a first surface 74 of the substrate 36. The doping level of the lightly doped amorphous silicon layer is typically less than or equal to $1 \times 10^{18}$ atoms/cm$^3$, as discussed previously. Subsequent to the deposition of the lightly doped amorphous silicon layer 73, a mask (not shown) can be positioned above the substrate 36 over the lightly doped amorphous silicon layer. After the mask is positioned, a second heavily doped amorphous silicon layer is deposited through the mask onto an upper surface 75 of the first lightly doped amorphous silicon layer. In this manner, the deposition of heavily doped amorphous silicon layer is selectively deposited on the lightly doped amorphous silicon layer 73 in pre-defined discrete areas (e.g., reference numeral 71) where the low resistance contact material is to be provided for utilization in attaching the metal contacts on the front surface 37 of the solar cell. The deposition of the second heavily doped amorphous silicon layer may be accomplished by increasing the concentration of the phosphorous-containing compound, such as phosphine, to approximately $1.5 \times 10^{-3}$ PH$_3$/SiH$_4$ ratio to provide a doping level greater than about $1 \times 10^{19}$ atoms/cm$^3$. After the first layer of lightly doped amorphous silicon 73 and the second layer of heavily doped discrete regions 71 have been deposited on the surface of the substrate 36, heat energy 355 is applied to a second surface 250 of the substrate 36 in a manner as discussed above in conjunction with FIG. 3. The end result after application of the heat in the RTP chamber is illustrated in FIG. 6, where the heat energy 355, as discussed previously, will activate and cause the dopant atoms in the lightly doped amorphous silicon layer 73 and heavily doped discrete regions 71 to diffuse into the substrate 36 and the underlying layer a desired distance. The heat energy 355 will also crystallize the lightly doped amorphous silicon layer 73 and heavily doped discrete regions 71 such that the first lightly doped layer 73 and the second heavily doped discrete regions 71, upon the completion of solid phase crystallization process, assume the same grain structure as the underlying crystalline silicon substrate 36 due to solid phase epitaxial growth from the first surface 74 of the substrate 36 having that grain structure, thereby forming crystalline lightly doped n-type layer 73' and heavily doped low contact resistance regions 71' to which the metallization will be applied to form the front contacts for the solar cell, as discussed above.

Figure 7A:
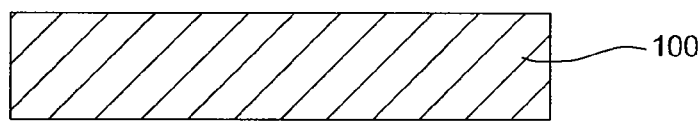
FIGS. 7a-7g are schematic diagrams showing a silicon substrate at various stages of processing to form the heavily doped regions for the selective emitter in accordance with another embodiment of the present invention.
Figure 7B:
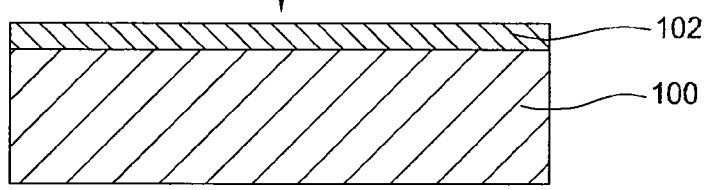
Figure 7C:
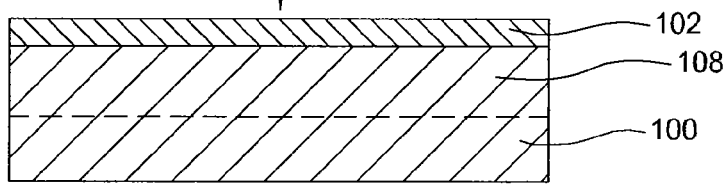
Figure 7D:
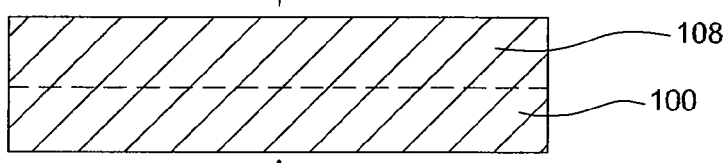
Figure 7E:
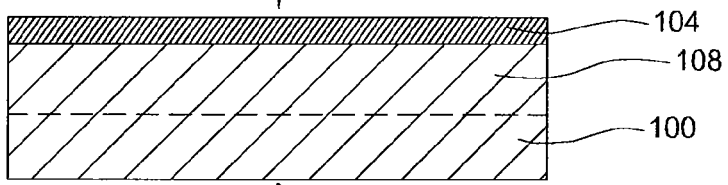
Figure 7F:
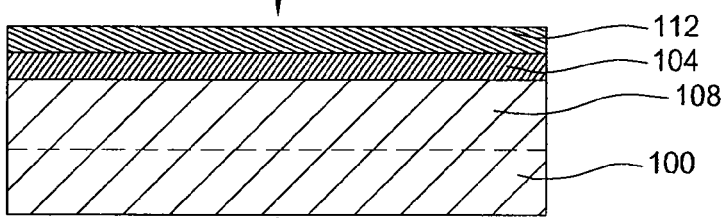

FIGS. 7a-7g are schematic diagrams showing a silicon substrate at various stages of processing to form heavily doped regions for the selective emitter in accordance with another embodiment of the present invention. As shown in FIG. 7a, a p-type crystalline silicon substrate 100 which has been texture-etched as described above in conjunction with FIG. 1 is provided. The substrate 100 is placed in a vacuum deposition chamber, such as a PECVD chamber, wherein precursors of silicon-containing compounds along with a hydrogen carrier gas and a phosphorous-containing compound, such as phosphine, is introduced to deposit a first lightly doped amorphous silicon layer 102, as shown in FIG. 7b. Thereafter, the substrate 100 with the lightly doped amorphous silicon layer 102 is annealed with directional heating at a temperature sufficient to activate and diffuse the phosphorous atoms into the silicon substrate 100, as shown in FIG. 7c. FIG. 7d shows the status of the substrate 100 after the lightly doped layer 102 of amorphous silicon has been diffused into the substrate 100, forming a lightly doped region 108 in the silicon substrate 100. As shown in FIG. 7e, subsequent to the directional annealing, a second heavily doped amorphous silicon layer 104 is deposited. In this embodiment, a phosphorous doping concentration in an upper region and a bottom region of the second heavily doped amorphous silicon layer 104 may be lower than a phosphorous doping concentration between the upper and bottom regions of the second heavily doped amorphous silicon layer 104. An optionally passivating layer 112 such as silicon nitride (SiN) is then applied over the heavily doped amorphous silicon layer 104, as shown in FIG. 7f. Therefore, the heavily doped amorphous silicon layer 104 is provided with a graded composition such that the bottom surface in touch with the lightly doped layer 108 and the top surface in contact with the passivation layer 112 has a dopant concentration of less than about $1 \times 10^{18}$ atoms/cm$^3$, while the remaining of the heavily doped amorphous silicon layer 104 between this two low doping regions has a higher dopant concentration, e.g., greater than about $1 \times 10^{19}$ atoms/cm$^3$.

Figure 7G:
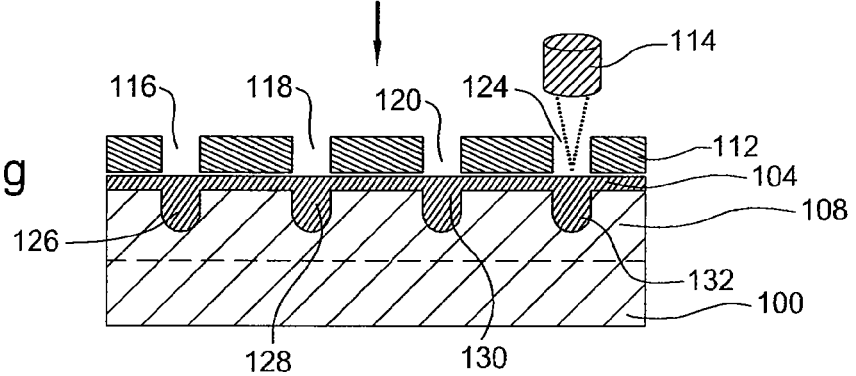

Thereafter, a scanning laser 114 may be utilized to ablate the silicon nitride passivating layer 112 from regions of the substrate surface that need to be metallized, for example, at regions 116, 118, 120 and 124 as shown in FIG. 7g. Simultaneously with the ablation of the silicon nitride (SiN) passivating layer 112, regions of the second heavily doped amorphous layer 104 are raised to a high temperature or may even be melted, so that the melted heavily doped amorphous silicon layer 104 is re-crystallized during cool down. During heating and recrystallization process steps, the dopant atoms within, or substantially adjacent to, the second heavily doped amorphous silicon layer 104 are activated and diffused out of the heavily doped amorphous silicon layer 104, forming a plurality of heavily doped regions 126, 128, 130 and 132 in the body of the substrate 100. The resulting structure is then passed on to a metallization process where the metal front contacts are to be applied to the regions 126, 128, 130 and 132 to provide the selective emitters for a silicon solar cell.

In this embodiment, the scanning laser 114 may be any laser that is capable of providing sufficient power to ablate the silicon nitride passivating layer while heating the silicon substrate without damaging other portions of the resulting device. Some examples of lasers that are capable of accomplishing this are neodymium doped YAG, neodymium doped $YVO_4$ solid state laser, or Yb doped glass fiber laser which can be operated in a pulsed mode with the desired beam parameters. It is advantageous to use the laser beam with a shorter wavelength such as a frequency doubled wavelength of 0.53 microns, or frequency tripled wavelength of 355 nm or lower. For these wavelengths of laser beam, the radiation is more rapidly absorbed near the surface of the silicon substrate, making it easier to controllably ablate the SiN without severely damaging the underlying silicon layers even on normal pulsed mode of operation. Numerous other ways of controlling the laser beam can also be used to give the desired effects that satisfy the needs of this invention. As indicated above, metallization is advantageously applied in a manner so as not to heat the substrate above a temperature at which the amorphous silicon layers would be crystallized.

FIGS. 8a-8c disclose one another embodiment of a process for forming a selective emitter in accordance with the present invention. As discussed previously and shown in FIG. 8a, once the amorphous silicon layers have been deposited and activated in a crystalline silicon substrate 134 using one of the methods described above, a passivating silicon nitride layer 136 may be deposited thereon. Thereafter, by utilization of a laser as described above, or other similar techniques, the silicon nitride layer 136 is removed as shown at region 138 to expose the upper surface of the substrate 134. Thereafter, a thin amorphous silicon layer 140 (e.g., less than about 50 nanometers), which is heavily doped with phosphorous atoms, is deposited over an upper surface of the silicon nitride layer 136 as well as on the exposed upper surface of the substrate 134, as shown in FIG. 8b.

Next, the directional heating is applied to epitaxially crystallize the amorphous silicon layer 140 while activating and diffusing the phosphorous atoms from the heavily doped amorphous silicon layer 140 into the upper surface of the crystalline silicon substrate 134, forming a heavily doped area 144 in the upper surface of the crystalline silicon substrate for use as a selective emitter. Thereafter, the structure is metallized as described above. The heavily doped amorphous silicon layer 140 may be removed after the metallization is completed or, alternatively, it may be left in place since it is very thin, so it will not severely affect the optical absorption in the silicon solar cell. Although the embodiment shown in FIG. 8a-8c includes only a heavily doped amorphous silicon layer 140, it is contemplated that a lightly doped amorphous silicon layer may be deposited prior to the deposition of heavily doped amorphous silicon layer, as discussed previously. Meanwhile, those skilled people in the art should be appreciated that the processes described in FIGS. 8a-8c may also include a step of heating the crystalline silicon substrate with a temperature gradient across the crystalline silicon substrate to cause solid phase epitaxial crystallization of the amorphous silicon layer, as discussed above.

It should be understood by those skilled in the art that the invention is not meant to be limited to certain embodiments and examples as described. The PECVD process described herein can be carried out using other chemical vapor deposition (CVD) chambers, and adjusting the gas flow rates, pressure, plasma density and the temperature so as to obtain high quality amorphous layers at practical deposition rates. As indicated previously, the amorphous silicon layers can be deposited using Hot Wire Chemical Deposition (HWCVD) Process, Low Pressure Chemical Vapor Deposition (LPCVD) Process, or Physical Vapor Deposition (PVD). It should be understood that embodiments of the invention can include scaling up or scaling down any of the process parameters or variables as described herein according to the number of substrates being utilized, chamber conditions, etc.

While the foregoing is directed to embodiments of the present invention, other and further embodiments of the invention may be devised without departing from the basic scope hereof and the scope thereof is determined by the claims that follow.

What is claimed is:

1. A method for forming an emitter for a solar cell in a crystalline silicon substrate, comprising:
   depositing a first amorphous silicon layer lightly doped with phosphorous on an upper surface of the crystalline silicon substrate;
   heating the crystalline silicon substrate and the first lightly doped amorphous silicon layer at a temperature sufficient to diffuse the phosphorous in the lightly doped amorphous silicon layer into the crystalline silicon substrate; and
   depositing a second amorphous silicon layer on the first amorphous silicon layer, wherein a phosphorous doping concentration in an upper region and a bottom region of the second amorphous silicon layer is lower than a phosphorous doping concentration between the upper and bottom regions of the second amorphous silicon layer but higher than the first lightly doped amorphous silicon layer.

2. The method of claim 1, wherein the first amorphous silicon layer has phosphorous concentration of less than about $1 \times 10^{18}$ atoms/cm$^3$ and the second amorphous silicon layer has phosphorous concentration of higher than about $1 \times 10^{22}$ atoms/cm$^3$.

3. The method of claim 1, further comprising:
   depositing a passivation layer over an upper surface of the second amorphous silicon layer, wherein the passivation layer comprises silicon nitride, silicon oxide, or silicon oxynitride.

4. The method of claim 3, further comprises laser ablating the passivation layer in selected areas and simultaneously heating of the upper surface of the second amorphous silicon layer and the upper surface of the crystalline silicon substrate.

* * * * *